(12) United States Patent
John

(10) Patent No.: US 7,839,136 B1
(45) Date of Patent: Nov. 23, 2010

(54) SYSTEM AND METHOD FOR TESTING RADIO FREQUENCY (RF) SHIELDING DEFECTS

(75) Inventor: Gerard John, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 53 days.

(21) Appl. No.: 12/481,525

(22) Filed: Jun. 9, 2009

(51) Int. Cl.
*G01R 31/00* (2006.01)

(52) U.S. Cl. .......................... 324/96; 324/627; 324/639

(58) Field of Classification Search ........................ None
See application file for complete search history.

(56) References Cited

U.S. PATENT DOCUMENTS 7,440,741 B2 * 10/2008 Comerford et al. .......... 455/300
2005/0061528 A1 * 3/2005 Bayar et al. ................... 174/51

* cited by examiner

*Primary Examiner*—Minh N Tang
(74) *Attorney, Agent, or Firm*—Weiss & Moy, P.C.

(57) ABSTRACT

An apparatus for testing a semiconductor device having an RF shield has a shield box. A test board is positioned in an interior of the shield box. A first surface of the test board has an area for attaching the semiconductor device. A shield device is attached to a second surface of the test board and beneath the area for attaching the semiconductor device. An antenna is positioned in the interior of the shield box and above the area for attaching the semiconductor device.

20 Claims, 5 Drawing Sheets

SYSTEM AND METHOD FOR TESTING RADIO FREQUENCY (RF) SHIELDING DEFECTS

FIELD OF THE INVENTION

This invention relates to Radio Frequency (RF) shielding and, more specifically, to a system and method for detecting shield defects by measuring a radiated signal level emitted from a semiconductor device under test.

BACKGROUND OF THE INVENTION

Radio Frequency (RF) shielding may be required on certain semiconductor devices and modules (hereinafter semiconductor device) in order to minimize Electro-Magnetic Interference (EMI) radiation from the semiconductor device. RF shielding is further required to prevent RF radiation from external sources from interfering with operation of the semiconductor device. In a semiconductor device which integrates multiple functions/modules (front end module+transmitter, radio+baseband, etc.) compartmental shielding may be required to minimize EMI radiation from the different components/modules and to prevent RF radiation from interfering with operation of the different components/modules in the semiconductor device.

Presently, there are several different methods used for EMI shielding. A first method is to attach a metal can over the component after the component is attached to the motherboard. An alternative to the shield attached method described above is an embedded EMI shield. In an embedded shield, the metal EMI shield is directly attached to the semiconductor package substrate by means of solder or a conductive adhesive. The shield may be fully embedded within the mold compound of the finished package or can be exposed after assembly. A third method is to apply a conformal shield. In this method, all of the components are placed on the substrate and the substrate, or strip, is over-molded using unit molding, or pin gate molding where individual mold caps are defined within the strip such that upward facing, exposed pads in the substrate remain exposed after the mold operation. A conductive coating is then applied to the strip such that it covers the units and also makes electrical contact to the upward facing pads. The strip is then singulated into individual units. Other methods for providing EMI shielding may use combinations of conformal shields which is applied over a mold cap and makes electrical contact with exposed portions of a wire and or wire fence; exposed metal traces formed through a full or partial saw process, laser ablated vias; and the like.

In general, for a metal can, shield defects may be easily identified by using visual inspection. Visual inspection will show areas on the metal can which are not properly attached to the motherboard and or semiconductor package substrate. However, with conformal shield coatings, visual inspections seldom will catch shield defects. The only reliable way to prove that a semiconductor device with a conformal shield has no shield defects is to treat the semiconductor device as an electrical circuit and to measure the radiated signal level emitted from the body of the semiconductor device. However, presently, there is no device to properly measure the radiated signal level emitted from the body of the semiconductor device under test. This is because it is difficult to distinguish the signal that may be radiating through a defect in the conformal shield since there are multiple signals that may interfere with a proper reading. For example, external noise sources, the signal being emitted through a main antenna port of the semiconductor device, the signal being radiated between the semiconductor device under test and the test board, and the like. All of the above mentioned, interfere with a proper reading of a signal that may be radiating through a defect in the conformal shield.

Therefore, a need existed to provide a system and method to overcome the above problem. The system and method would provide a reliable way of showing if a semiconductor device with a conformal shielding has minimal and or no shield defects.

SUMMARY OF THE INVENTION

An apparatus for testing a semiconductor device having an RF shield has a shield box. A test board is positioned in an interior of the shield box. A first surface of the test board has an area for attaching the semiconductor device. A shield device is attached to a second surface of the test board and beneath the area for attaching the semiconductor device. An antenna is positioned in the interior of the shield box and above the area for attaching the semiconductor device.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
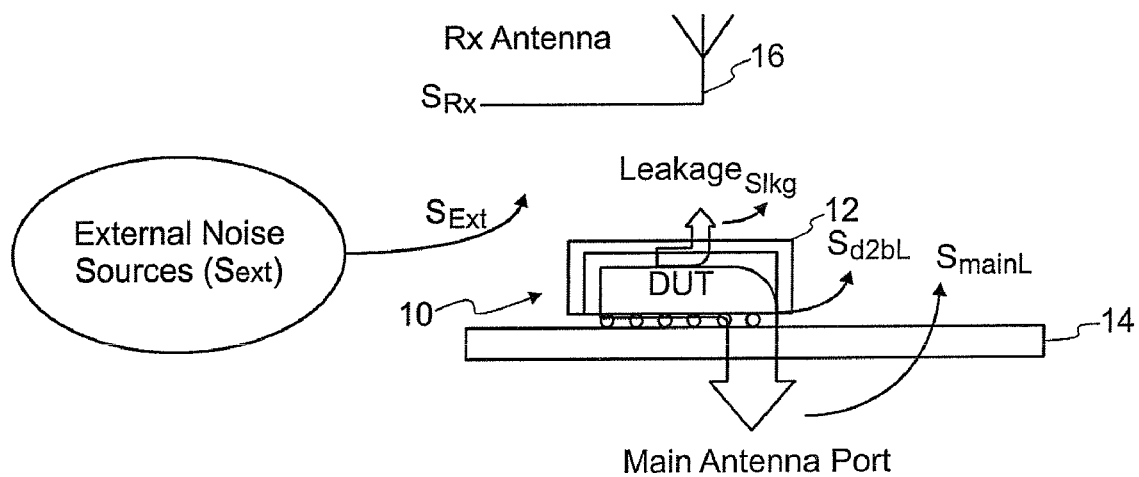
FIG. 1 is a simplified block diagram showing signals radiating from a semiconductor device under test.

The only reliable way to prove that a semiconductor device with a conformal shield has minimal and or no shield defects is to treat the semiconductor device as an electrical circuit and to measure the radiated signal level emitted from the body of the semiconductor device. Referring now to FIG. 1, a semiconductor device 10 having a conformal shield 12 is shown. The semiconductor device 10 is positioned on a test board 14. The test board 14 is generally a printed circuit board (PCB) or the like. The test board 14 is generally connected to a testing device which sends test signals to the semiconductor device 10 via the test board 14. To measure the radiated signal level emitted from the body of the semiconductor device 10, an antenna 16 may be used. The antenna 16 may be used to receive any RF energy being radiated from the semiconductor device 10.

It is difficult to properly measure the radiated signal level emitted from the body of the semiconductor device 10 under test. This is due to the fact that it is difficult to distinguish the signal that may be radiating through a defect in the conformal shield 12 since there are multiple signals that may interfere with a proper reading. As shown in FIG. 1, the antenna 16 is suppose to measure the signal $S_{slkg}$ which is the signal being radiated through the conformal shield 12. However, the antenna 16 will further receive the signal $S_{d2bL}$ which is the signal radiated between the semiconductor device 10 under test and the test board 14, the signal $S_{mainL}$ which is the signal emitted through a main antenna port of the semiconductor device 10, and external noise sources $S_{ext}$. Thus, the signal $S_{Rx}$ being received by the antenna 16 is actually equal to the combination of signal $S_{slkg}$, the signal $S_{d2bL}$, the signal $S_{mainL}$, and external noise sources $S_{ext}$ as shown by the following equation:

$$S_{Rx}=S_{slkg}+S_{d2bL}+S_{ext}+S_{MainL}$$

Figure 2:
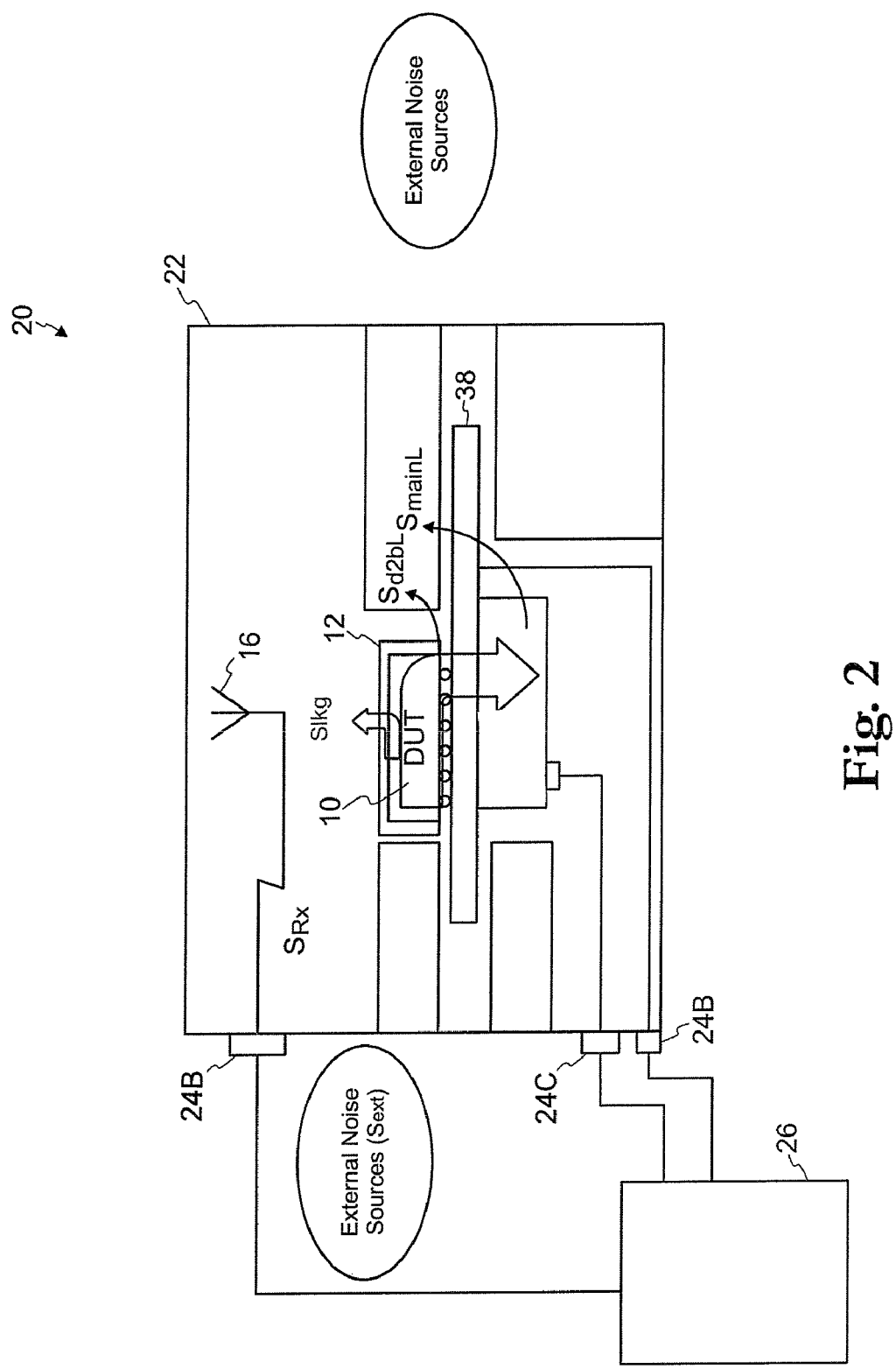
FIG. 2 is a simplified block diagram showing the system of the present invention.

Referring now to FIG. 2, a simplified block diagram of a system 20 for testing the semiconductor device 10 with a conformal shielding 12 is shown. The system 20 will determine if the conformal shield 12 on the semiconductor device 10 has any shield defects. The system 20 will reduce the RF interference from other sources to provide a more accurate measurement of the signal being radiated through the conformal shield $S_{slkg}$.

The system 20 may use a shield box 22. The shield box 22 is used for housing the semiconductor device 10 during testing of the semiconductor device 10 for shield defects. The shield box 22 provides RF isolation of the semiconductor device 12 from external noise sources. Thus, the shield box 22 minimizes external noise sources $S_{ext}$. The shield box 22 may be designed to further minimize the signal $S_{d2bL}$ which is the signal radiated between the semiconductor device 10 under test and the test board 14 and the signal $S_{mainL}$, which is the signal emitted through a main antenna port of the semiconductor device 10. Thus, the shield box 22 may allow one to more accurately measure the signal $S_{slkg}$ which is the signal being radiated through the conformal shield 12.

Figure 3:
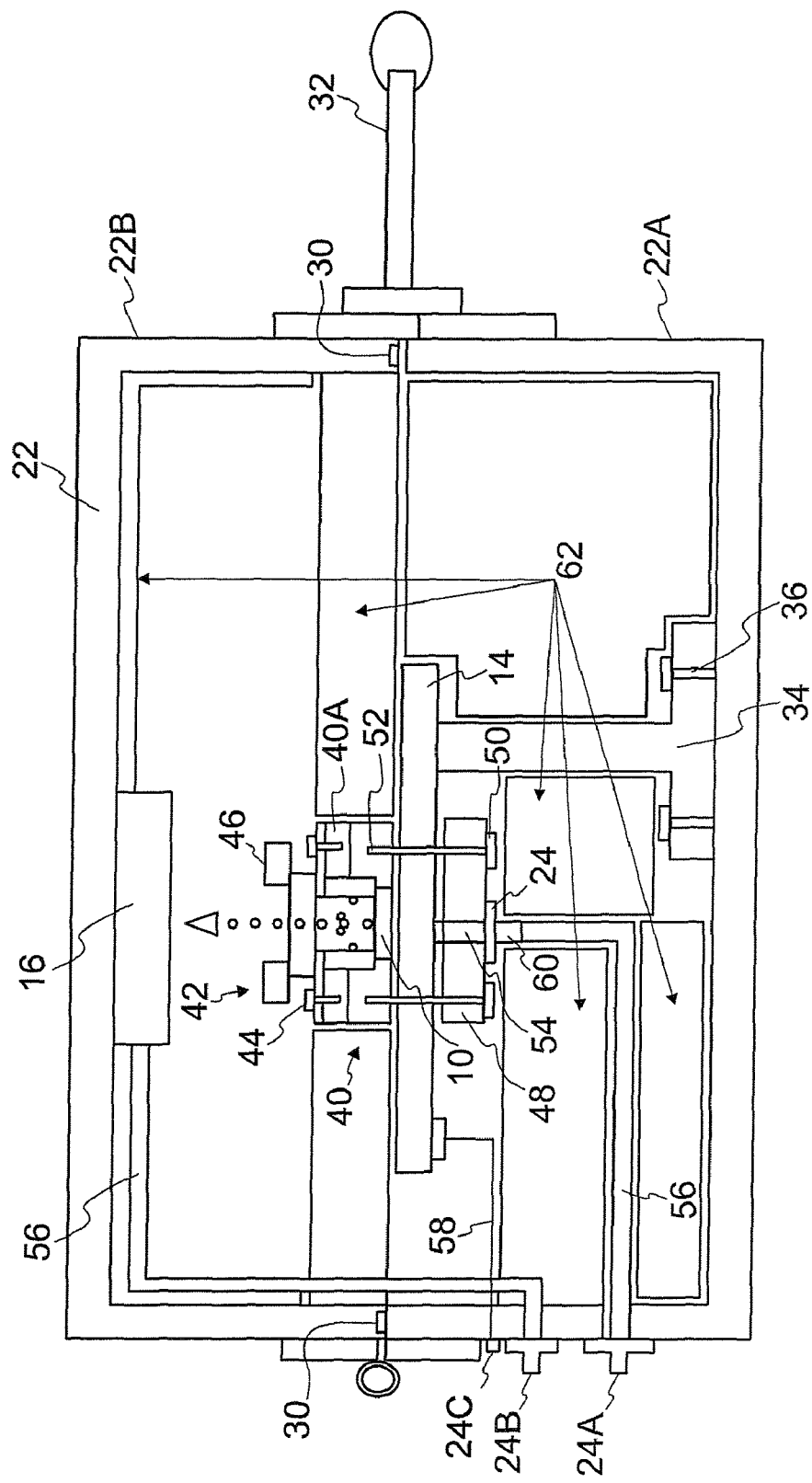
FIG. 3 is a cross-sectional view of the shield box of FIG. 2 with a semiconductor device in the shield box.

The shield box 22 may have one or more connectors 24. The connectors 24 may be used to provide signal connections to the shield box 22 for testing and monitoring. As shown in FIG. 2, the shield box 22 may be coupled to testing equipment 26. The testing equipment 26 may be used to send signals to and receive signals from the semiconductor device 10 as well as to receive measurement signals from the antenna 16. In accordance with one embodiment, the testing equipment 26 may be used to send test signals to the semiconductor device 10 and receive the signal $S_{slkg}$ which is the signal being radiated through the conformal shield 12. The testing equipment 26 may be coupled to the shield box 22 via the connectors 24. In accordance with one embodiment, the testing equipment 26 may be a computer system, a spectrum analyzer, or the like. The above is only given as an example and should not be seen as to limit the scope of the present invention Referring now to FIGS. 2-4, the shield box 22 will be described in more detail. The shield box 22 is used for housing the semiconductor device 10 during testing of the semiconductor device 10 for shield defects. The shield box 22 may be formed of an insulating rigid material with a metallic coating. The metallic coating should be of sufficient thickness to provide adequate RF shielding. Thus, the shield box 22 provides RF isolation of the semiconductor device 10 from external noise sources by minimizes the external noise sources $S_{ext}$ from reaching the semiconductor device 10 under test. The shield box 22 may be similar to commercially available RF shield boxes provided by TESCOM®. Specifically, the shield box 22 may be similar to model TC-5910D provided by TESCOM®.

The shield box 22 may have a lower body section 22A having an open interior section. A lid member 22B may be coupled to the lower body section 22A and also have an open interior section. In the present embodiment, the lid member 22B is hingly coupled to the lower body section 22A. A handle 32 may be attached to the lower body section 22A and or the lid member 22B. The handle 32 would be use to raise and lower the lid member 22B. In accordance with one embodiment, the handle 32 is a latching handle to close and lock the lid member 22B to the lower body section 22A.

A pair of lift devices 28 may be attached to side surfaces of the lid member 22B and the lower body section 22A. The lift devices 28 may be used to raise the lid member 22B and keep the lid member 22B in an open position as well as to gently lower the lid member 22B on to the lower body section 22A to close the shield box 22. In accordance with one embodiment, the lift devices 28 are shock absorber type devices. However, this is only given as an example and should not be seen as to limit the scope of the present invention.

A gasket 30 may be formed on the lower body section 22A and or the lid member 22B. The gasket 30 may be formed around the entire perimeter of the lower body section 22A and or the lid member 22B. In accordance with one embodiment, the gasket 30 is an RF gasket which will aid in preventing RF signals from entering or leaving the shield box 22. Thus, the gasket 30 helps to further improve RF isolation.

The shield box 22 may have a plurality of connectors 24 formed on an exterior surface of the shield box 22. The connectors 24 may be used to send and or receive signals to and from the shield box 22. In accordance with one embodiment, the shield box 22 has one or more RF connector ports 24A, 24B. The RF connector ports 24A may be attach to an antenna 16. The antenna 16 may be used to measure an RF signal level being radiated within the shield box 22. A signal line 56 may be used to couple the RF connector ports 24A to the antenna 16. In accordance with one embodiment, an RF cable is used as the signal line 56. However, this is only given as an example and should not be seen as to limit the scope of the present invention.

The shield box 22 may further have one or more data ports 24C. The data ports 24C may be used to communicate and or control the semiconductor device 10 being tested. In accordance with one embodiment, the data ports 24C are EMI filtered data ports.

Located in the open interior section of the lower body section 22A is a stand member 34. The stand member 34 is attached to a bottom interior section of the lower body section 22A. In accordance with one embodiment, screw devices 36 are used to secure a first end of the stand member 34 to the bottom interior section of the lower body section 22A. The stand member 34 is used to hold a test board 14 in the interior of the shield box 22.

The test board 14 is attached to a second end of the stand member 34. The test board 14 may be a Printed Circuit Board (PCB) or the like. The test board 14 is used to send test signals to the semiconductor device 10 being test. In accordance with one embodiment of the present invention, the test board 14 may also be coupled to one or more of the data ports 24C. A test signal line 58 may be coupled to the test board 14 and the data ports 24C to communicate and or control the semiconductor device 10 being tested.

In accordance with one embodiment, the test board 14 has a socket 40 attached to a first surface of the test board 14. The socket 40 is used to hold and secure the semiconductor device 10 to be tested. The socket 40 is generally electrically coupled to the test board 14. Pogo pins or similar contacts may be used to electrically couple the socket 40 to the test board 14. In accordance with one embodiment, the socket 40 may be removably coupled to the test board 14. This allows different size sockets 40 and thus different size semiconductor devices 10 to be coupled to the test board 14 for testing. The socket 40 is generally made out of a non-conductive material like plastic or the like. The above is given as an example and should not be seen as to limit the scope of the present invention.

In accordance with one embodiment, the socket 40 is a manual socket 40A. The manual socket 40A may have a lid member 42 attached thereto. One or more latches 44 may be used to hingly couple the lid member 42 to the manual socket 40A.

The lid member 42 may have a tension device 46 coupled to the lid member 42. The tension device 46 is used to ensure constant contact on the semiconductor device 10 under test. The tension device 46 allows a user to adjust the tension/pressure that the tension device 46 places on the semiconductor device 10 thereby ensuring constant contact on the semiconductor device 10 under test.

A shield device 48 is attached to a second surface of the test board 14. The shield device 48 is generally positioned on the second surface of the test board 14 underneath where the socket 40 is positioned. The shield device 48 is used to minimize the signal $S_{mainL}$ being emitted through a main antenna port of the semiconductor device 10. The shield device 48 may be attached to the test board 14 via pins 50. In accordance with the embodiment shown in FIG. 2, the pins 50 that attach the shield device 48 to the test board 14 extend up through the test board 14 and extend out of the first surface of the test board 14. In this embodiment, since the pins 50 extend up through the first surface of the test board 14, the pins 50 are used as alignment pins for the socket 40. Thus, the socket 40 may have alignment openings 52 formed on a bottom surface of the socket 40. By placing the socket 40 onto the test board 14 so that the pins 50 are placed through the alignment openings 52, the socket 40 will be properly aligned on the test board 14.

The shield device 48 may have a connector 60 formed on a bottom surface thereof. The connector 60 may be used to attach the shield device 48 to the RF connector ports 24A. In general, the signal line 56 may be used to couple the RF connector ports 24A to the shield device 48.

Figure 4:
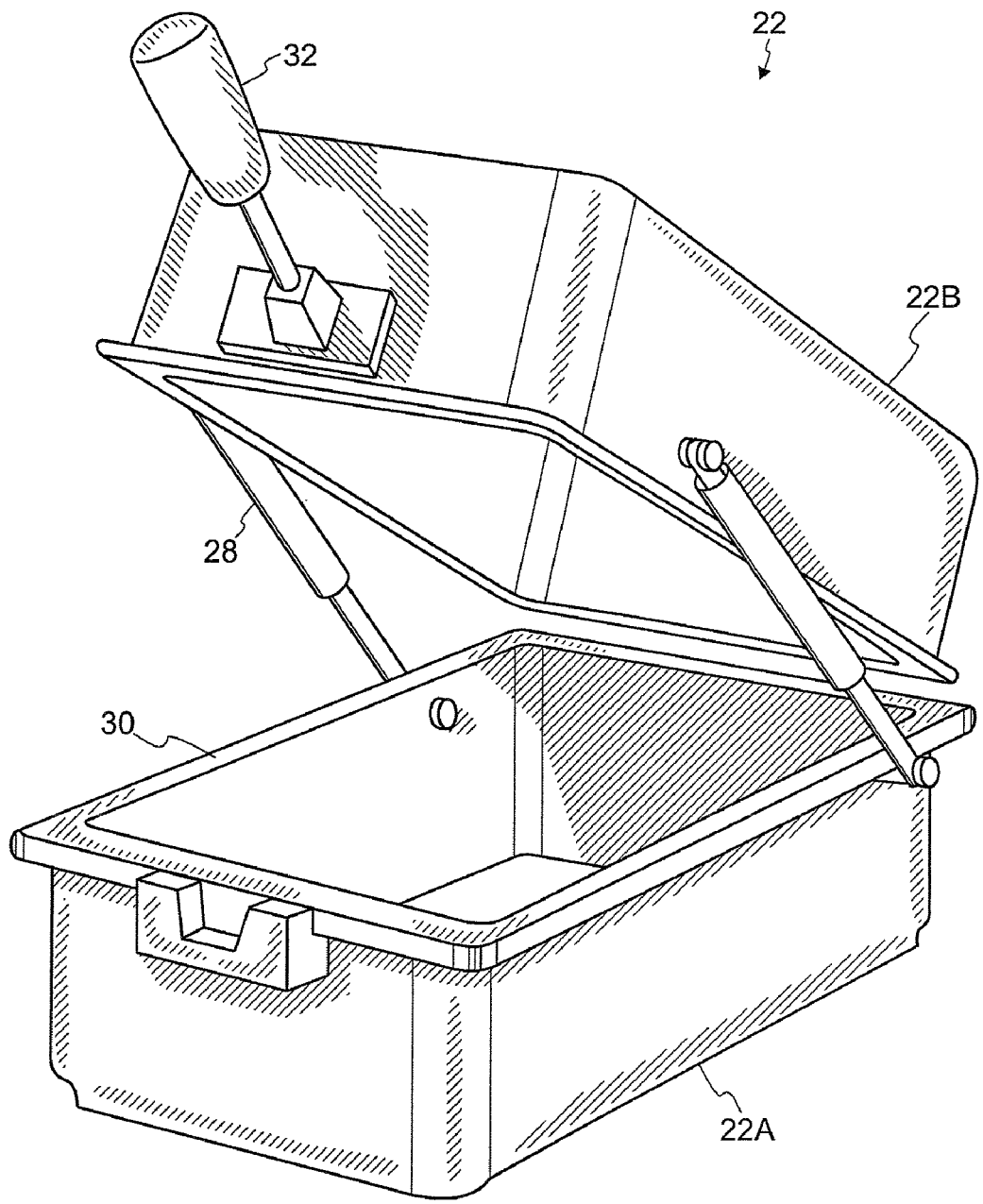
FIG. 4 is an elevated perspective view of a shield box with the interior components removed.
Figure 5:
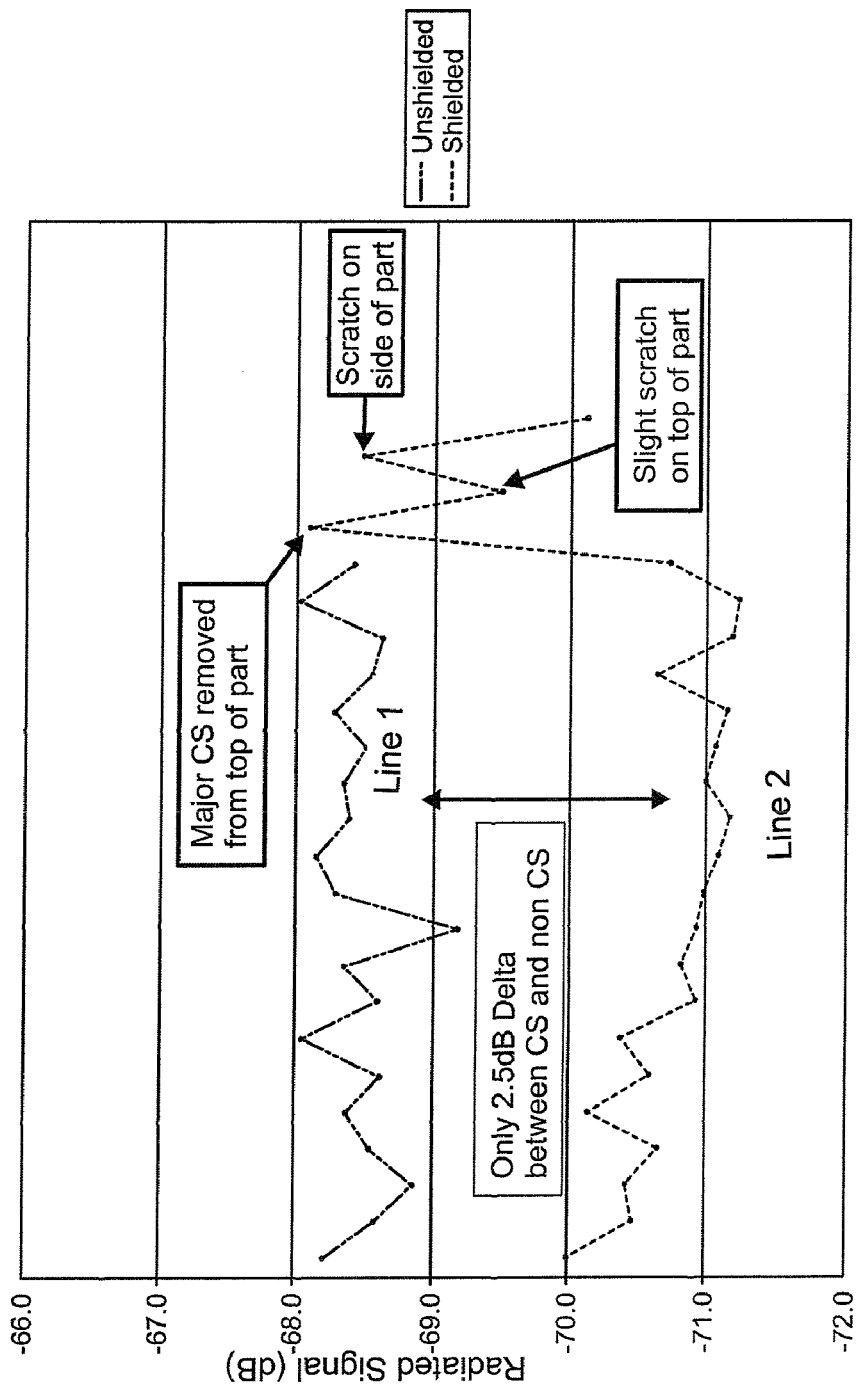
FIG. 5 is a graph showing defect detection using the system and method of the present invention.

An absorption material 62 may be positioned in the interior of the shield box 22. The absorption material 62 may be used to absorb RF signals being radiated within the shield box 22. The absorption material 62 may be placed in open areas in the interior of the shield box 22. In accordance with one embodiment, the absorption material 62 is placed around the socket 40. As shown in FIG. 4, the absorption material 62 is placed around the socket 40 and extends away from the socket to the edges on the interior of the shield box 22. The absorption material 62 placed around the socket 40 is used to absorb the signal $S_{d2bL}$ which is the signal radiated between the semiconductor device 10 under test and the test board 14. Additional absorption material 62 may be placed below the shield device 48 and or around the stand member 34. The absorption material 62 may be used to fill in open areas in the interior of the lower body section 22A. The absorption material 62 used to fill in open areas in the interior of the lower body section 22A may be used to further minimize the signal $S_{mainL}$ being emitted through the main antenna port of the semiconductor device 10. Additional absorption material 62 may also be placed around an interior perimeter of the lid member 22B. The absorption material 62 may placed around an interior perimeter of the lid member would be positioned along a top and side walls of the lid member 22B. The absorption material 62 may be a foam material which may be impregnated with carbon. The absorption material 62 may be a commercially available absorption material similar to model FL-4500CL produced by ETS•Lindgreni®.

The system 20 may use one or more antennas 16. The antennas 16 may be placed in the interior of the shield box 22. The antennas 16 may be used to measure RF signals being emitted within the shield box 22. In accordance with one embodiment, an antenna 16 may be positioned above the semiconductor device 10. The antenna 16 may be positioned on and extend down from the lid member 22B. The antenna 16 above the semiconductor device 10 may be coupled to an RF connector port 24B via a signal line 56. The antenna 16 placed above the semiconductor device 10 may be used to measure the signal $S_{slkg}$ which is the signal being radiated through the conformal shield 12. Since the shield box 22 will minimizes external noise sources $S_{ext}$, and the shield device 48 will minimize the signal $S_{mainL}$ being emitted through a main antenna port of the semiconductor device 10, and the absorption material 62 will minimize the signal $S_{d2bL}$ which is the signal being radiated between the semiconductor device 10 under test and the test board 14, the antenna 16 placed above the semiconductor device 10 will provide a more accurate measurement of the signal $S_{slkg}$ which is the signal being radiated through the conformal shield 12.

In accordance with another embodiment, RF signals from the main antenna port of the device 10 being tested are routed via the RF connector 60 through an RF cable 56 to the RF connector 24A. The RF signals are routed to the test equipment 26 to measure the RF output of the device 10 under test.

Referring now to FIG. 4, a chart is displayed showing a radiated signal measured by the RF antenna 16 above the semiconductor device 10. Line 1 shows a radiated signal measured by the RF antenna 16 above the semiconductor device having no conformal shield. Line 2 shows a radiated signal measured by the RF antenna 16 above the semiconductor device 10 having a conformal shield 12. As shown in the chart, there is approximately a 2.5 dB delta between a semiconductor device having no conformal shield and the semiconductor device 10 having a conformal shield 12. This delta should not be construed to be the absolute improvement obtained by the application of the conformal shield material, but as indication of a change in performance due to the conformal shield material and or lack thereof. As shown in Line 2, if the conformal shield 12 is partially removed and or scratched, the radiated signal will raise 0.5 dB or more.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. An apparatus for testing a semiconductor device having an RF shield comprising:
   a shield box;
   a test board positioned in an interior of the shield box, a first surface of the test board having an area for attaching the semiconductor device;
   a shield device attached to a second surface of the test board and beneath the area for attaching the semiconductor device; and
   a first antenna positioned in the interior of the shield box and above the area for attaching the semiconductor device.

2. An apparatus for testing a semiconductor device having an RF shield in accordance with claim 1, further comprising RE absorption material placed in the interior of the shield box.

3. An apparatus for testing a semiconductor device having an RF shield in accordance with claim 1, further comprising a socket attached to the first surface of the test board on the area for attaching the semiconductor device.

4. An apparatus for testing a semiconductor device having an RF shield in accordance with claim 3, further comprising RF absorption material placed in the interior of the shield box, the RF absorption material positioned around the socket and in open areas in a bottom section of the shield box.

5. An apparatus for testing a semiconductor device having an RF shield in accordance with claim 4, wherein the RF absorption material is further positioned around an interior perimeter of a lid section of the shield box.

6. An apparatus for testing a semiconductor device having an RF shield in accordance with claim 3, further comprising:
   a lid member attached to the socket; and
   a tension device positioned on the lid member to adjust a pressure placed on the semiconductor device.

7. An apparatus for testing a semiconductor device having an RF shield in accordance with claim 1, further comprising a shield device connector formed of the shield device.

8. An apparatus for testing a semiconductor device having an RF shield in accordance with claim 5, further comprising a pair of pin members to attach the shield device to the second surface of the test board, the pin members extending through the first surface of the test board to align the socket to the first surface of the test board.

9. An apparatus for testing a semiconductor device having an RF shield in accordance with claim 1, wherein the shield box has a plurality of connectors for attaching the shield box to testing equipment.

10. An apparatus for testing a semiconductor device having an RF shield in accordance with claim 1, wherein the shield box has an RF gasket formed along a rim of one of a bottom section of the shield box or a lid section of the shield box.

11. An apparatus for testing a semiconductor device having an RF shield comprising:
    means for providing RF isolation from external sources;
    a test board positioned in an interior of the means for providing RF isolation, a first surface of the test board having an area for attaching the semiconductor device;
    means attached to a second surface of the test board for minimizing RF signals emitted from a bottom surface of the semiconductor device; and
    means positioned in the interior of the shield box and above the area for attaching the semiconductor device for recording RF signals emitted from a top surface of the semiconductor device.

12. An apparatus for testing a semiconductor device having an RF shield in accordance with claim 11, further comprising means placed in the interior of the means for providing RF isolation for absorbing RF signals.

13. An apparatus for testing a semiconductor device having an RF shield in accordance with claim 11, further comprising means attached to the first surface of the test board for attaching the semiconductor device to the test board.

14. An apparatus for testing a semiconductor device having an RF shield in accordance with claim 13, further comprising means for absorbing RF signals placed in the interior of the means for providing RF isolation, the means for absorbing positioned around the means for attaching the semiconductor device to the test board and in open areas in a bottom section of the means for providing RF isolation.

15. An apparatus for testing a semiconductor device having an RF shield in accordance with claim 13, further comprising:
    a lid member attached to the means for attaching the semiconductor device to the test board; and
    means positioned on the lid member for adjusting a pressure placed on the semiconductor device.

16. An apparatus for testing a semiconductor device having an RF shield in accordance with claim 11, further comprising:
    a shield device connector formed of the means for minimizing RF signals emitted from a bottom surface of the semiconductor device; and
    means coupled to the shield device connector for recording RF signals emitted from the bottom surface of the semiconductor device.

17. An apparatus for testing a semiconductor device having an RF shield in accordance with claim 13, further comprising means for attaching the means for minimizing RF signals emitted from a bottom surface of the semiconductor device to the second surface of the test board, the means for attaching extending through the first surface of the test board to align the means for attaching the semiconductor device to the test board.

18. A method for testing a semiconductor device for shielding defects comprising:
    providing an RF shield box;
    positioning a test board in an interior of the shield box, a first surface of the test board having an area for attaching the semiconductor device;
    attaching a shield device to a second surface of the test board and beneath the area for attaching the semiconductor device;
    positioning an antenna in the interior of the shield box and above the area for attaching the semiconductor device;
    attaching the semiconductor device to the first surface of the test board;
    sending test signals to the test board; and
    monitoring an RF signal emitted from a top surface of the semiconductor device.

19. The method of claim 18, further comprising placing RF absorption material in the interior of the shield box.

20. The method of claim 18, further comprising:
    attaching a socket to the first surface of the test board; and
    adjusting a tension device on the socket to provide a adjust a pressure the tension device places on the semiconductor device.

* * * * *